United States Patent
Kim et al.

(10) Patent No.: US 8,735,839 B2
(45) Date of Patent: May 27, 2014

(54) PASTES FOR PHOTOELECTRIC CONVERSION LAYERS OF X-RAY DETECTORS, X-RAY DETECTORS AND METHODS OF MANUFACTURING THE SAME

(75) Inventors: Sun-il Kim, Osan-si (KR); Jae-chul Park, Suwon-si (KR); Chang-jung Kim, Yongin-si (KR); Sang-wook Kim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 238 days.

(21) Appl. No.: 13/246,221

(22) Filed: Sep. 27, 2011

(65) Prior Publication Data

US 2012/0181440 A1  Jul. 19, 2012

(30) Foreign Application Priority Data

Jan. 19, 2011  (KR) .................. 10-2011-0005388

(51) Int. Cl.
 *G01T 1/24*  (2006.01)
(52) U.S. Cl.
 USPC .................. 250/370.01; 250/336.1
(58) Field of Classification Search
 USPC .................. 250/370.01
 See application file for complete search history.

(56) References Cited

U.S. PATENT DOCUMENTS

| | | | |
|---|---|---|---|
| 4,405,702 A * | 9/1983 | Shirai et al. | 430/60 |
| 5,204,202 A * | 4/1993 | Ishikawa et al. | 430/66 |
| 5,730,922 A * | 3/1998 | Babb et al. | 264/258 |
| 5,892,227 A * | 4/1999 | Schieber et al. | 250/370.12 |
| 6,559,451 B1 * | 5/2003 | Izumi et al. | 250/370.08 |
| 6,900,442 B2 * | 5/2005 | Zur | 250/370.11 |
| 2007/0122543 A1 * | 5/2007 | Yanoff et al. | 427/64 |
| 2010/0092769 A1 * | 4/2010 | Shoji et al. | 428/337 |
| 2010/0116999 A1 * | 5/2010 | Tumer et al. | 250/370.13 |
| 2010/0230607 A1 * | 9/2010 | Kitada | 250/370.08 |
| 2011/0206769 A1 * | 8/2011 | Chen et al. | 424/487 |

FOREIGN PATENT DOCUMENTS

| | | |
|---|---|---|
| JP | 2010003713 A | 1/2010 |
| KR | 20040070161 A | 8/2004 |

* cited by examiner

*Primary Examiner* — David Porta
*Assistant Examiner* — Taeho Jo
(74) *Attorney, Agent, or Firm* — Harness, Dickey & Pierce, P.L.C.

(57) ABSTRACT

A paste for a photoelectric conversion layer used in an X-ray detector includes photoconductive particles, an organic polymer binder, a first organic solvent to dissolve the organic polymer binder, and a second organic solvent. The second organic solvent has a boiling point in a range of between about 150° C. and about 210° C., inclusive.

25 Claims, 8 Drawing Sheets

PASTES FOR PHOTOELECTRIC CONVERSION LAYERS OF X-RAY DETECTORS, X-RAY DETECTORS AND METHODS OF MANUFACTURING THE SAME

CROSS-REFERENCE TO RELATED APPLICATION(S)

This application claims priority under 35 U.S.C. §119 to Korean Patent Application No. 10-2011-0005388, filed on Jan. 19, 2011, in the Korean Intellectual Property Office, the disclosure of which is incorporated herein in its entirety by reference.

BACKGROUND

1. Field

Example embodiments relate to pastes for photoelectric conversion layers of X-ray detectors, X-ray detectors including photoelectric conversion layers, and methods of manufacturing the same.

2. Description of the Related Art

X-rays, which have a wavelength between visible rays and gamma rays, can penetrate solid objects. The penetration amount of X-rays depends on the density of the inside of the solid objects. Images of the interior of an object are created by measuring the amount of X-rays that penetrate the object.

In one conventional example, photosensitive films are used to record X-ray images. An alternative is known as digital radiography (DR) in which X-ray images are taken by using X-ray detectors.

Conventionally, flat panel systems including semiconductors are used as X-ray detectors. Flat panel systems have a structure based on thin film transistor (TFT) active matrix arrays. Conventional flat panel systems are classified as indirect conversion-type and direct conversion-type systems.

A conventional indirect conversion-type flat panel system utilizes a scintillator and a photodiode composed of amorphous silicon (a-Si), whereas a conventional direct conversion-type flat panel system utilizes a photoconductive material such as amorphous selenium (a-Se).

In a TFT active matrix array, electric charges are generated by X-rays and stored in a capacitor. The electric charges are read as a signal using a multiple-receiving method in which the signal of each column of the array is received by a peripheral circuit unit with rows being switched one by one.

An conventional indirect conversion-type a-Si flat panel system includes an a-Si TFT, a PIN photodiode composed of amorphous silicon, and a scintillator. In this flat panel system, the scintillator absorbs irradiated X-rays, thereby generating visible rays. The photodiode detects and converts the visible rays into an electric signal and stores the electric signal. The stored electric signal is read by operation of the a-Si TFT. However, the a-Si flat panel system requires a relatively complicated manufacturing process. Moreover, reducing the resolution of the a-Si flat panel system to below 100 μm is relatively difficult due to light spreading by the geometric structure of the scintillator.

Recently, research into flat panels using amorphous selenium (a-Se) as a photoconductive material has been conducted with regard to direct conversion-type flat panel systems. However, application of a relatively high voltage (e.g., thousands of volts) is needed to activate the amorphous selenium. Moreover, amorphous selenium requires relatively high energy for forming electron-hole pairs. Also, the atomic weight of amorphous selenium is smaller than that of other semiconductor compounds. Thus, formation of a relatively thick a-Se layer is needed to achieve relatively high luminous efficiency of the flat panel.

SUMMARY

Example embodiments provide pastes for photoelectric conversion layers of X-ray detectors, photoelectric conversion layers, X-ray detectors, and/or methods of manufacturing the same.

X-ray detectors according to at least some example embodiments are capable of higher sensitivity and/or larger areas at lower manufacturing costs, by using the pastes for photoelectric conversion layers.

Additional aspects will be set forth in part in the description which follows and in part, will be apparent from the description, or may be learned by practice of the example embodiments.

At least one example embodiment provides a paste for a photoelectric conversion layer. The paste includes: photoconductive particles; an organic polymer binder; a first organic solvent to dissolve the organic polymer binder; and a second organic solvent having a boiling point in the range of about 150° C. to about 210° C., inclusive.

The photoconductive particles may include one of mercury (II) iodide ($HgI_2$) particles, lead(II) iodide ($PbI_2$) particles, bismuth triiodide ($BiI_3$) particles, thallium bromide (TlBr) particles, lead(II) oxide (PbO) particles, cadmium telluride (CdTe) particles, cadmium zinc telluride (CdZnTe) particles, and any mixtures thereof.

The organic polymer binder may include one of a polyvinyl butyral (PVB) resin, an acryl resin, a phenoxy resin, a polyester resin, a polyvinyl formal resin, a polyamide resin, a polystyrene resin, a polycarbonate resin, a polyvinyl acetate resin, a polyurethane resin, an epoxy resin, and any mixtures thereof.

The first organic solvent may dissolve the organic polymer binder to form a binder solution. The first organic solvent may include one of dipropylene glycol monomethyl ether (DPGME), butyl cellosolve (BC), and any mixtures thereof.

The second organic solvent may include one of butyl cellosolve acetate (BCeA), KOCOSOL, butyl cellosolve (BC), ethyl 3-ethoxypropionate (EEP), and any mixtures thereof. The first organic solvent may be the same or substantially the same as the second organic solvent.

When the photoconductive particles are $HgI_2$ particles, the organic polymer binder may include one of a polyvinyl butyral resin, an acryl resin, a phenoxy resin, and any mixtures thereof. In this example, the first organic solvent may be one of dipropylene glycol monomethyl ether (DPGME), butyl cellosolve (BC), and any mixtures thereof, and the second organic solvent may be one of butyl cellosolve acetate (BCeA), KOCOSOL, butyl cellosolve (BC), ethyl 3-ethoxypropionate (EEP), and any mixtures thereof.

The amount of organic polymer binder may be in the range of about 2.5 to about 15, inclusive, parts by weight with respect to about 100 parts by weight of the photoconductive particles.

At least one other example embodiment provides an X-ray detector. The X-ray detector includes: a readout device on a substrate; and a photoelectric conversion layer on the readout device. The photoelectric conversion layer is formed from a paste including: photoconductive particles; an organic polymer binder; a first organic solvent to dissolve the organic polymer binder; and a second organic solvent having a boiling point in the range of about 150° C. to about 210° C., inclusive.

According to at least some example embodiments, the readout device may include a switching device and a charge storage device electrically connected by a pixel electrode. The switching device may be a thin film transistor (TFT) device. The charge storage device may be a capacitor.

At least one other example embodiment provides a method of manufacturing a photoelectric conversion layer. According to at least this example embodiment, the method includes: coating a paste on a substrate; and heat treating the substrate with the paste coated thereon. The paste includes: photoconductive particles; an organic polymer binder; a first organic solvent to dissolve the organic polymer binder; and a second organic solvent having a boiling point in the range of about 150° C. to about 210° C., inclusive. The substrate with the paste coated thereon may be heat treated at a temperature in the range of about 50° C. to about 80° C., inclusive.

A readout device, such as a TFT device, a complementary metal oxide semiconductor (CMOS) device, or a charge coupled device (CCD), may be formed on the substrate.

The photoconductive particles may include one of $HgI_2$ particles, $PbI_2$ particles, $BiI_3$ particles, TlBr particles, PbO particles, CdTe particles and CdZnTe particles, and any mixtures thereof.

The organic polymer binder may include one of a polyvinyl butyral (PVB) resin, an acryl resin, a phenoxy resin, a polyester resin, a polyvinyl formal resin, a polyamide resin, a polystyrene resin, a polycarbonate resin, a polyvinyl acetate resin, a polyurethane resin, an epoxy resin, and any mixtures thereof.

The first organic solvent may include one of dipropylene glycol monomethyl ether (DPGME), butyl cellosolve (BC), and any mixtures thereof.

The second organic solvent may be one of butyl cellosolve acetate (BCeA), KOCOSOL, butyl cellosolve (BC), ethyl 3-ethoxypropionate (EEP), and any mixtures thereof.

At least one other example embodiment provides a method of manufacturing an X-ray detector. According to at least this example embodiment, the method includes: coating a paste on a substrate; heat treating the substrate with the paste coated thereon; and forming an upper electrode on the photoelectric conversion layer. The paste includes: photoconductive particles; an organic polymer binder; a first organic solvent to dissolve the organic polymer binder; and a second organic solvent having a boiling point in the range of about 150° C. to about 210° C., inclusive. The substrate with the paste coated thereon may be heat treated at a temperature in the range of about 50° C. to about 80° C., inclusive.

BRIEF DESCRIPTION OF THE DRAWINGS

These and/or other aspects will become apparent and more readily appreciated from the following description of example embodiments, taken in conjunction with the accompanying drawings in which.

DETAILED DESCRIPTION

Figure 1:
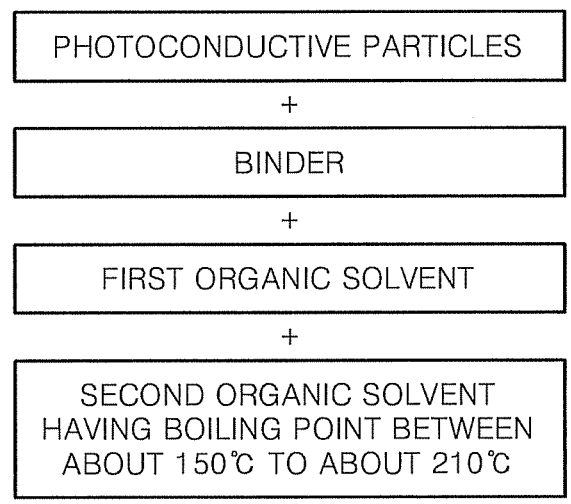
FIG. 1 is a block diagram showing elements of a paste for a photoelectric conversion layer of an X-ray detector according to an example embodiment.

Example embodiments will now be described more fully with reference to the accompanying drawings, in which some example embodiments are shown. In the drawings, the thicknesses of layers and regions are exaggerated for clarity. Like reference numerals in the drawings denote like elements.

Detailed illustrative embodiments are disclosed herein. However, specific structural and functional details disclosed herein are merely representative for purposes of describing example embodiments. Example embodiments may be embodied in many alternate forms and should not be construed as limited to only those set forth herein.

It should be understood, however, that there is no intent to limit this disclosure to the particular example embodiments disclosed. On the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of this disclosure. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIG. 1 is a block diagram showing elements of a paste for a photoelectric conversion layer of an X-ray detector according to an example embodiment.

Referring to FIG. 1, the paste for a photoelectric conversion layer of an X-ray detector includes: photoconductive particles, a binder, a first organic solvent, and a second organic solvent. As discussed in more detail below, these elements are combined to form a paste and then a photoelectric conversion layer.

The photoconductive particles may include a semiconductor material such as mercury(II) iodide ($HgI_2$), lead(II) iodide ($PbI_2$), bismuth triiodide ($BiI_3$), thallium bromide (TlBr), lead(II) oxide (PbO), cadmium telluride (CdTe), cadmium zinc telluride (CdZnTe), or any mixtures thereof. These semiconductor materials have a relatively wide band-gap energy, a relatively high atomic number, and require relatively low energy for forming electron-hole pairs. The relatively wide band-gap energy enables reduction of dark current at lower temperatures (e.g., room temperature, e.g., about 20° C. to about 30° C.). The relatively high atomic number enables improved photon absorption and/or reduces radiation exposure. The relatively low energy for forming electron-hole pairs enables a relatively high charge conversion rate. The photoconductive particles may be in the form of a powder.

In one example, the photo conductive particles may be $HgI_2$ particles. The $HgI_2$ particles have a relatively high atomic weight and density so that even a relatively thin photoelectric conversion layer sufficiently absorbs X-rays, while maintaining relatively low X-ray ionization energy. In other words, $HgI_2$ is a sufficiently (e.g., excellent) photoconductive material.

According to at least some example embodiments, single crystalline $HgI_2$ may be used. However, forming single-crystals of $HgI_2$ is relatively costly and time-consuming. Thus, an X-ray detector using $HgI_2$ may be limited to a relatively small area.

According to at least one example embodiment, polycrystalline $HgI_2$ is used to form the paste. In one example, the paste includes a layer of polycrystalline $HgI_2$ formed by mixing a concentrated $HgI_2$ powder and a binder. The paste is deposited on a substrate, and the deposited paste is heat treated.

The boiling point of $HgI_2$ is about 200° C., and thus, the heat treatment temperature is less than about 200° C. When using, for example, $HgI_2$, a thin film may be formed at a relatively low temperature. A paste enabling formation of a relatively thin film at relatively low temperatures is desirable because when the temperature of the heat treatment process performed after screen printing is relatively high, dark current may increase.

The above-mentioned binder disperses the photoconductive particles in powder form without particle agglomeration, and enables formation of the paste. The binder may also be in powder form. According to at least some example embodiments, the binder may be an organic polymer material.

When the heat treatment process is performed at a relatively low temperature, at least a portion of the binder may remain in the relatively thin photoelectric conversion layer after the heat treatment process is completed. The remaining portion of the binder may affect the sensitivity of the photoelectric conversion layer. Thus, the sensitivity of the photoelectric conversion layer may depend (e.g., largely depend) on the type and/or amount of binder used in forming in the paste.

According to at least some example embodiments, the binder may be an organic polymer binder, such as a polyvinyl butyral (PVB) resin, an acryl resin, a phenoxy resin, a polyester resin, a polyvinyl chloride (PVC) resin, a polyvinyl formal resin, a polyamide resin, a polystyrene resin, a polycarbonate resin, a polyvinyl acetate resin, a polyurethane resin, an epoxy resin, or any mixtures thereof. In a more specific example, a binder such as a polyvinyl butyral resin, an acryl resin, or a phenoxy resin may be used with $HgI_2$ particles.

The amount of the binder used in the paste may be in the range of about 2.5 to about 15, inclusive, parts by weight with respect to about 100 parts by weight of the photoconductive particles.

When the amount of the binder is less than about 2.5 parts by weight with respect to about 100 parts weight of the photoconductive particles, the photoconductive particles may not disperse. Thus, the sensitivity of the formed photoelectric conversion layer may be reduced.

When the amount of the binder is greater than about 15 parts by weight with respect to about 100 parts by weight of the photoconductive particles, the binder may interrupt the movement of electrons formed in the photoconductive particles. Thus, the sensitivity of the formed photoelectric conversion layer may be reduced.

Still referring to FIG. 1, the first organic solvent is used to dissolve the binder enabling preparation of a binder solution. The first organic solvent may include, for example, dipropylene glycol monomethyl ether (DPGME) and butyl cellosolve (BC).

The second organic solvent is used to adjust the viscosity of the paste. According to at least some example embodiments, the second organic solvent may have a boiling point in the range of about 150° C. to about 210° C., inclusive. When the paste for a photoelectric conversion layer is printed and then heat treated at less than about 100° C., at least a portion of the second organic solvent may remain in the photoelectric conversion layer after the heat treatment process is complete. If this occurs, then the photosensitivity of the photoelectric conversion layer may decrease and/or dark current may increase.

When using a second organic solvent having a boiling point in the range of about 150° C. to about 210° C., inclusive, the second organic solvent may be completely removed from the paste and the resultant photoelectric conversion layer. As a result, the powder-type photoconductive particles disperse satisfactorily, thereby reducing the surface roughness of the photoelectric conversion layer and increasing the sensitivity of the photoelectric conversion layer. According to at least some example embodiments, the second organic solvent may be butyl cellosolve acetate (BCeA), KOCOSOL, butyl cellosolve (BC), or ethyl 3-ethoxypropionate (EEP).

In at least one example embodiment, the first organic solvent and the second organic solvent may be the same or substantially the same. Moreover, the first and second organic solvents may be any solvent capable of dissolving the binder.

In this example, the amount of the first organic solvent may be in the range of about 3 wt % to about 10 wt %, inclusive, with respect to the total weight of the paste. The amount of the second organic solvent may be in the range of about 5 wt % to about 40 wt %, inclusive, with respect to the total weight of the paste.

When the amount of the first organic solvent is less than about 3 wt % with respect to the total weight of the paste, dissolving the binder may be relatively difficult.

When the amount of the first organic solvent is greater than about 10 wt % with respect to the total weight of the paste, the first organic solvent may remain in the formed photoelectric conversion layer after the paste dries, thereby reducing the sensitivity and dark current properties of the photoelectric conversion layer.

When the amount of the second organic solvent is less than about 5 wt % with respect to the total weight of the paste, the viscosity of the paste is relatively high. The relatively high viscosity may cause difficulty in printing the paste and/or increased surface roughness of the photoelectric conversion layer after the printing process.

When the amount of the second organic solvent is greater than about 40 wt % with respect to the total weight of the paste, at least a portion of the second organic solvent may remain in the formed photoelectric conversion layer after the paste dries, thereby reducing the sensitivity and dark current properties of the resultant photoelectric conversion layer.

The paste may further include additives such as a dispersant, an antifoaming agent, and a leveling agent.

Figure 2:
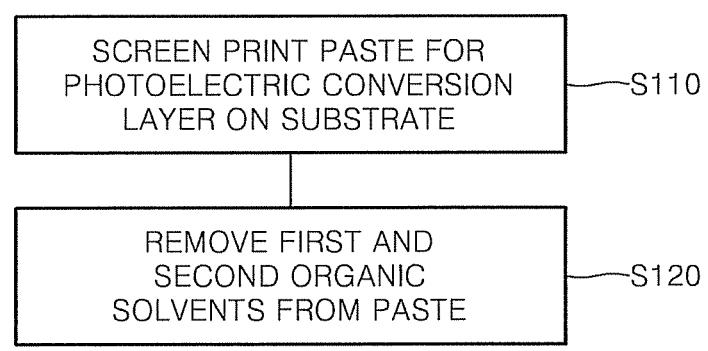
FIG. 2 is a flowchart for explaining a method of manufacturing a photoelectric conversion layer on a substrate according to another example embodiment.

FIG. 2 is a flowchart for explaining a method of manufacturing a photoelectric conversion layer for an X-ray detector according to another example embodiment.

Referring to FIG. 2, at S110 a paste is printed (e.g., screen printed) on a substrate for an X-ray detector. The substrate for an X-ray detector may include a readout device such as a thin film transistor (TFT) device, a complementary metal oxide semiconductor (CMOS) device, a charge coupled device (CCD), or the like. In one example, the readout device may include a switching device (e.g., a TFT) and a charge storage device (e.g., a capacitor). The paste for a photoelectric conversion layer may be the same or substantially the same as the paste described above with reference to FIG. 1. That is, for example, the paste may be formed by combining photoconductive particles, a binder, a first organic solvent, and a second organic solvent.

As discussed above with regard to FIG. 1, the photoconductive particles may be formed of a semiconductor material such as $HgI_2$, $PbI_2$, $BiI_3$, $TlBr$, $PbO$, $CdTe$, $CdZnTe$, or any mixtures thereof.

The binder may be, for example, a polyvinyl butyral (PVB) resin, an acryl resin, a phenoxy resin, a polyester resin, a polyvinyl chloride (PVC) resin, a polyvinyl formal resin, a polyamide resin, a polystyrene resin, a polycarbonate resin, a polyvinyl acetate resin, a polyurethane resin, an epoxy resin, or any mixtures thereof.

The first organic solvent may be, for example, dipropylene glycol monomethyl ether (DPGME), butyl cellosolve (BC), or any mixtures thereof.

The second organic solvent may be a solvent having a boiling point in the range of about 150° C. to about 210° C., inclusive, such as, butyl cellosolve acetate (BCeA), KOCOSOL, butyl cellosolve (BC), ethyl 3-ethoxypropionate (EEP), or any mixtures thereof.

The amount of the binder used in the paste may be in the range of about 2.5 to about 15, inclusive, parts by weight with respect to about 100 parts by weight of the photoconductive particles. The paste for a photoelectric conversion layer may further include additives such as a dispersant, an antifoaming agent, and a leveling agent.

After printing the paste on the substrate at S110, the first and second organic solvents are removed from the paste at S120 to form a photoelectric conversion layer on the substrate. In one example, the first and second organic solvents are removed from the paste by heat treating the substrate and the paste screen printed thereon at a temperature between about 50° C. and about 80° C., inclusive.

FIGS. 3A through 3D are diagrams sequentially illustrating a method of forming a photoelectric conversion layer according to an example embodiment.

Figure 3A:
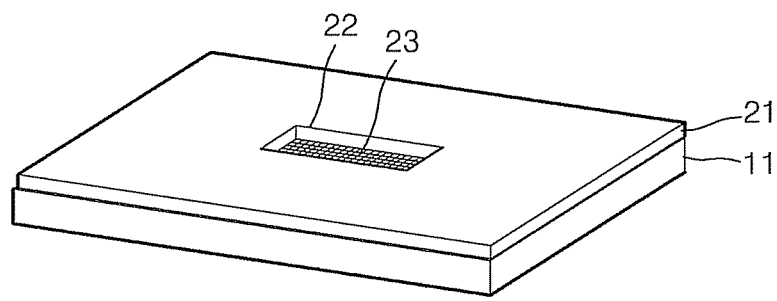
FIGS. 3A through 3D are diagrams sequentially illustrating a method of forming a photoelectric conversion layer according to an example embodiment.

Referring to FIG. 3A, a mask 21 having an opening 22 and a mesh 23 positioned in the opening is aligned on a substrate 11.

Figure 3B:
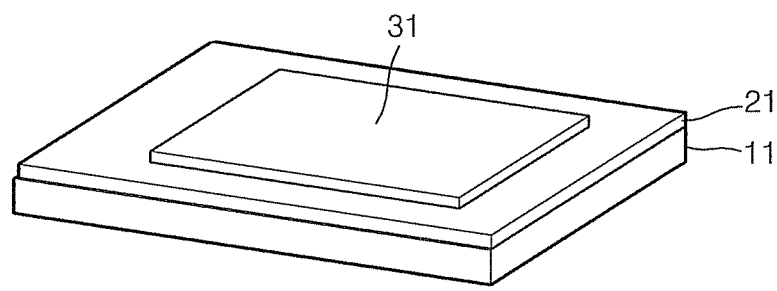

Referring to FIG. 3B, a paste 31 is spread on the mask 21. In one example, a scraper may be used to spread the paste 31 on the mask 21. The paste 31 is spread so as to cover the opening 22, the mesh 23 and at least a portion of the upper surface of the mask 21.

Figure 3C:
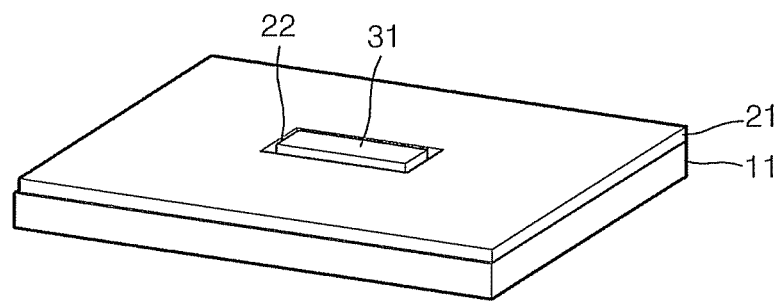

Referring to FIG. 3C, the paste 31 spread on the mask 21 is pushed into the opening 22. In one example, squeezer or squeegee may be used to push the paste 31 into the opening 22.

Figure 3D:
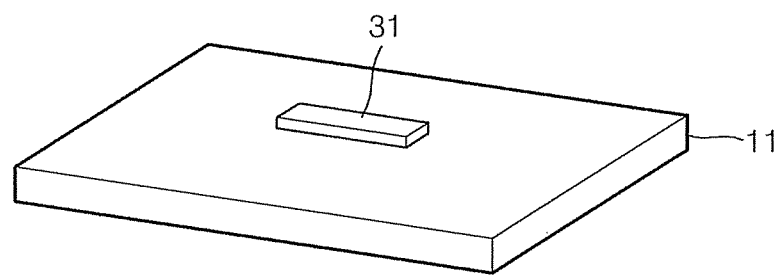

As shown in FIG. 3D, the mask 21 is then removed from the substrate 11.

Example embodiments of pastes for photoelectric conversion layers may be used in radiation detectors including X-ray or y-ray detectors.

Figure 4:
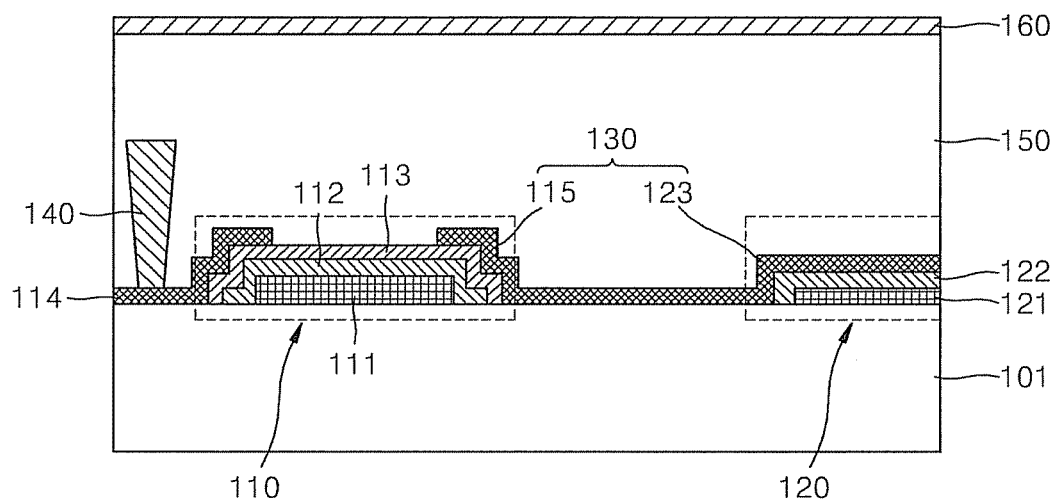
FIG. 4 is a cross-sectional view schematically illustrating a substrate of an X-ray detector on which a photoelectric conversion layer is formed according to an example embodiment.

FIG. 4 is a cross-sectional view schematically illustrating an X-ray detector according to an example embodiment.

Referring to FIG. 4, a switching device 110 and a charge storage device 120 are formed on a substrate 101. In this example, the switching device 110 is a thin film transistor (TFT) device and the charge storage device 120 is a capacitor for storing charges. However, example embodiments are not limited to a TFT device and a capacitor.

As shown, the TFT device 110 includes: a gate electrode 111; a gate insulating layer 112 on the gate electrode 111; an active layer 113 on the gate insulating layer 112; a source electrode 114 on a portion of the active layer 113 and the substrate 101; and a drain electrode 115 on an other portion of the active layer 113 and an other portion of the substrate 101. The capacitor 120 includes a lower electrode 121, a dielectric layer 122, and an upper electrode 123.

In the example embodiment shown in FIG. 4, the drain electrode 115 of the TFT device 110 is connected to the upper electrode 123 of the capacitor 120, thereby forming a pixel electrode 130. In other words, the pixel electrode 130 includes the drain electrode 115 and the upper electrode 123, and electrically connects the TFT device 110 with the capacitor 120. The source electrode 114 is connected to a data line 140.

A photoelectric conversion layer 150 is formed to cover the TFT device 110, the capacitor 120, and the data line 140. The photoelectric conversion layer 150 may be formed as described above with regard to FIGS. 1-3D.

An upper electrode 160 is formed on the photoelectric conversion layer 150.

In example operation, electron-hole pairs generated in the photoelectric conversion layer 150 in response to irradiated X-radiation are transferred to the capacitor 120 by an electric field formed between the upper electrode 160 and the pixel electrode 130. The stored electron-hole pairs are read as an electric signal by operation of the TFT device 110.

FIGS. 5A through 7 are graphs illustrating example experimental results. Pastes prepared according to Example 1 and Comparative Examples 1 through 3 were used to obtain these experimental results. Each of the pastes was screen printed between two electrodes and heat-treated to form a photoelectric conversion layer. The sensitivities and dark currents of the photoelectric conversion layers were measured, and the results of Example 1 were compared with the results of Comparative Examples 1 through 3.

The sensitivity of the photoelectric conversion layer was obtained by measuring a change in resistance by changing a bias voltage between an upper electrode and a lower electrode, while the photoelectric conversion layer was irradiated by X-rays generated at a peak voltage ($V_p$) of about 30 kV of an X-ray generator. The dark current of the photoelectric conversion layer is a current value measured when a voltage is applied to electrodes, while X-rays are not irradiated to the photoelectric conversion layer.

Figure 5A:
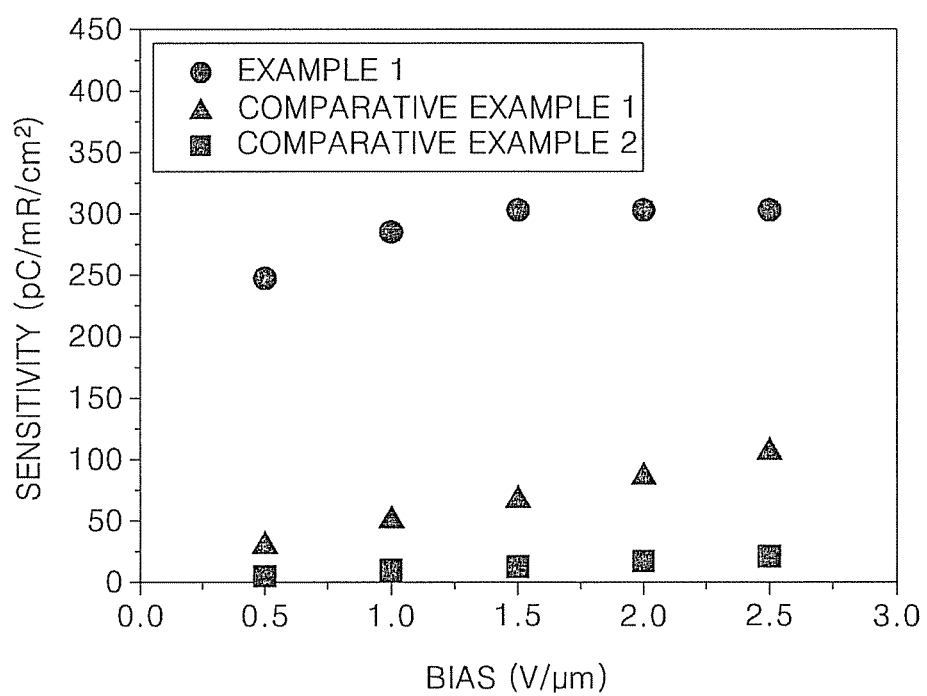
FIGS. 5A and 5B are graphs respectively showing example sensitivity and dark current of a photoelectric conversion layer relative to the type of a second organic solvent in a paste for the photoelectric conversion layer according to an example embodiment.
Figure 5B:
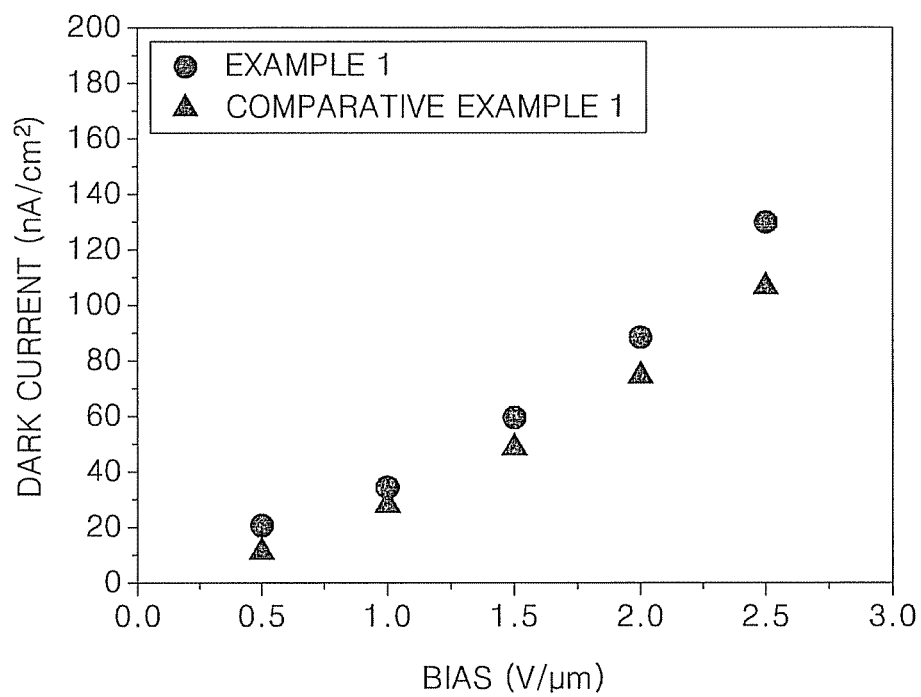

In more detail, FIGS. 5A and 5B are graphs respectively showing example sensitivities and dark currents according to bias voltage for photoelectric conversion layers prepared using pastes of Example 1, Comparative Example 1, and Comparative Example 2. In these examples, the type of a second organic solvent in the pastes differs.

In more detail, the pastes of Example 1, Comparative Example 1, and Comparative Example 2 shown in FIG. 5A were all prepared using $HgI_2$ particles as the photoconductive material, polyvinyl butyral (PVB) as the binder, and dipropylene glycol monomethyl ether (DPGME) as the first organic solvent. The amount of PVB as a binder was about 3.5 parts by weight with respect to about 100 parts by weight of the $HgI_2$ particles.

However, cellosolve (BC) was used as the second organic solvent in the paste of Example 1, ethyl cellosolve (EC) was used as the second organic solvent in the paste of Comparative Example 1, and ethyl carbitol acetate (ECA) was used as the second organic solvent in the paste of Comparative Example 2. The boiling point of EC is about 135° C., the boiling point of BC is about 171° C., and the boiling point of ECA is about 217° C. Each of the photoelectric conversion layers of Example 1, Comparative Example 1, and Comparative Example 2 was formed to a thickness of about 100 μm, and a heat treatment process was performed at about 60° C. for about 12 hours.

As shown in FIG. 5A, the sensitivity of the photoelectric conversion layer prepared in Comparative Example 2 using the ECA solvent having the highest boiling point was the lowest, and sensitivity of the photoelectric conversion layer prepared in Comparative Example 1 using the EC solvent having the lowest boiling point was also relatively low. Regarding the photoelectric conversion layer prepared using the paste of Comparative Example 2 including ECA, its relatively low sensitivity is a result of the relatively high boiling point of ECA, which results in at least a portion of the ECA solvent remaining after completing the heat treatment process performed at about 60° C.

Regarding the photoelectric conversion layer prepared using the paste of Comparative Example 1 including EC, the boiling point of the EC solvent is so low that the EC solvent is removed relatively easily because the EC solvent evaporates relatively easily. As a result, the surface roughness of the photoelectric conversion layer increases. The increase in surface roughness of the photoelectric conversion layer results in charge scattering at an interface between the photoelectric conversion layer and an upper electrode, which may result in a reduction in the sensitivity of the photoelectric conversion layer.

The photoelectric conversion layer formed of the paste of Example 1 including BC exhibited the highest sensitivity from among the three photoelectric conversion layers. The boiling point of the BC solvent (about 171° C.) causes the BC solvent to remain in the paste for an appropriate time before being removed, which results in satisfactory dispersion of powder-type photoconductive particles. The boiling point of the BC solvent is also within a range enabling the BC solvent to be completely removed from the paste during heat treatment.

FIG. 5B is a graph showing example measurement results of dark currents according to bias voltage for the photoelectric conversion layer prepared using the paste of Comparative Example 1 including EC and the photoelectric conversion layer prepared using the paste of Example 1 including BC.

As shown in FIG. 5B, the dark current of the photoelectric conversion layer formed of the paste of Example 1 including BC was similar to that of the photoelectric conversion layer formed of the paste of Comparative Example 1 including EC.

Figure 6:
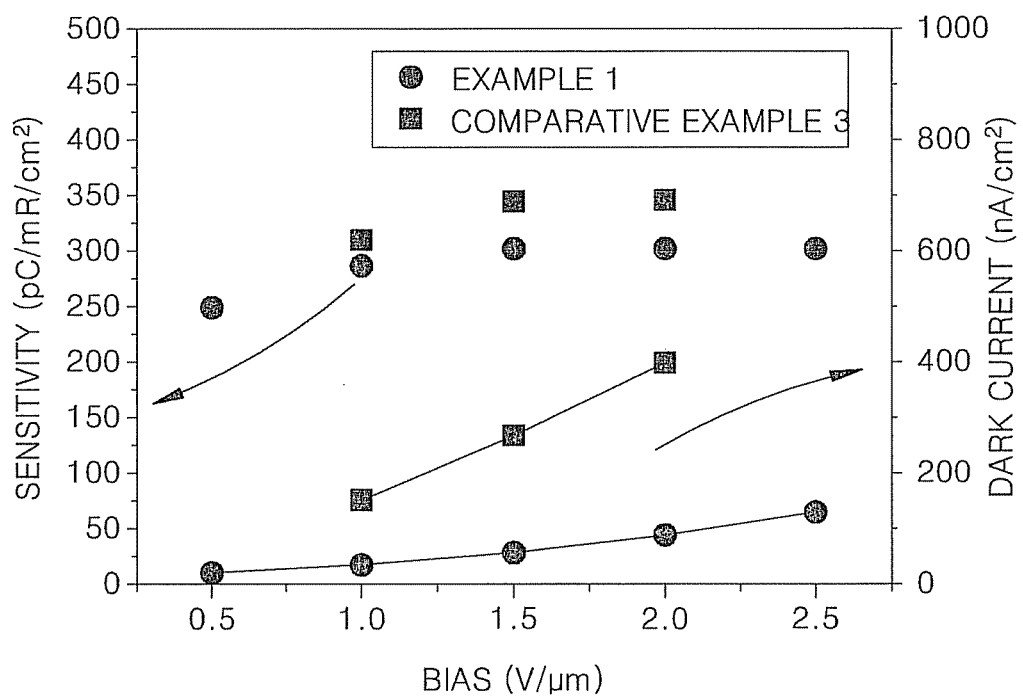
FIG. 6 is a graph showing example sensitivity and dark current of a photoelectric conversion layer formed using a paste prepared according to Example 1 including a cellosolve (BC) as a second organic solvent, compared with example sensitivity and dark current of a photoelectric conversion layer formed using a paste prepared according to Comparative Example 3 including ethyl carbitol acetate (ECA) as a second organic solvent.

FIG. 6 is a graph showing example sensitivity and dark current relative to bias voltage for a photoelectric conversion layer formed using a paste prepared according to Example 1 including cellosolve (BC) as a second organic solvent, compared with the sensitivity and dark current of a photoelectric conversion layer formed using a paste prepared according to Comparative Example 3 including ethyl carbitol acetate (ECA) as a second organic solvent.

In this example, the paste of Comparative Example 3 was prepared using $HgI_2$ particles as the photoconductive material, polyvinyl butyral (PVB) as the binder, dipropylene glycol monomethyl ether (DPGME) as the first organic solvent, and ethyl carbitol acetate (ECA) as a second organic solvent. The paste was screen printed on a substrate and then heat treated at about 100° C. The paste of Example 1 including butyl cellosolve (BC) as a second organic solvent was heat treated at about 60° C. as described above.

As shown in FIG. 6, the photoelectric conversion layer formed of the paste of Comparative Example 3 including ECA as a second organic solvent and heat treated at about 100° C. exhibited a slightly higher sensitivity than that of the photoelectric conversion layer formed of the paste of Example 1, while the dark current of the photoelectric conversion layer formed of the paste of Comparative Example 3 was significantly higher than that of the photoelectric conversion layer formed of the paste of Example 1.

The increase in the dark current of the photoelectric conversion layer of Comparative Example 1 results from relatively high heat treatment temperature, which degrades the physical properties of the $HgI_2$ particles. The photoelectric conversion layer formed of the paste of Example 1 including BC as a second organic solvent and heat treated at about 60° C. exhibited a slightly lower sensitivity than that of the photoelectric conversion layer formed of the paste of Comparative Example 3 including ECA, while the dark current of the photoelectric conversion layer of Example 1 was lower (e.g., substantially lower) than that of the photoelectric conversion layer of Comparative Example 3. The decrease in the dark current of the photoelectric conversion layer of Example 1 results from the relatively low heat treatment temperature, which reduces and/or prevents degradation of the physical properties of the $HgI_2$ particles, and complete removal of the second organic solvent during heat treatment.

Figure 7:
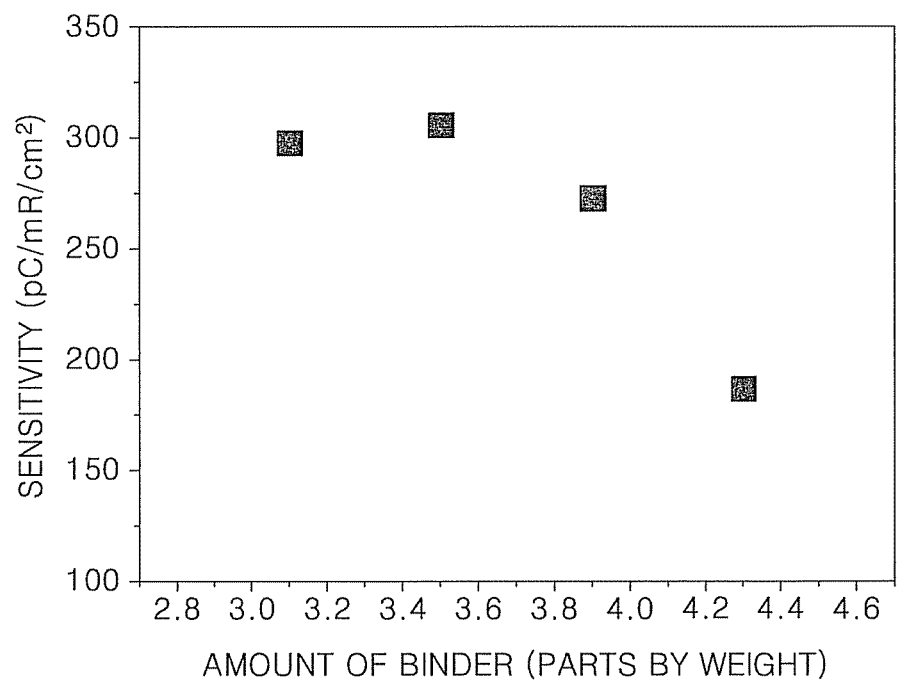
FIG. 7 is a graph showing example sensitivity of a photoelectric conversion layer relative to the amount of a binder with respect to photoconductive particles in a paste for a photoelectric conversion layer according to an example embodiment.

FIG. 7 is a graph showing the sensitivity of a photoelectric conversion layer according to the amount of a binder with respect to photoconductive particles in a paste for a photoelectric conversion layer according to an example embodiment. The amount of the binder is represented as parts by weight of the binder with respect to about 100 parts by weight of photoconductive particles.

The pastes used in photoelectric conversion layers described with reference to FIG. 7 included $HgI_2$ particles as photoconductive particles, polyvinyl butyral (PVB) as the binder, and butyl cellosolve (BC) as the first and second organic solvents. Each photoelectric conversion layer was formed to a thickness of about 120 μm, and the sensitivity thereof was measured. After the screen printing process, a heat treatment process was performed at about 60° C.

As shown in FIG. 7, when the amount of the binder was about 10 parts by weight, the sensitivity of the photoelectric conversion layer was higher in the other photoelectric conversion layers. When the amount of the binder was greater than about 15 parts by weight, the sensitivity thereof decreased. Thus, the greater the amount of the binder, the lower the sensitivity of the photoelectric conversion layer. This results from the relatively high electrical resistance of the binder, which inhibits transfer of charge carriers in the photoelectric conversion layer.

When the amount of the binder is relatively small, powder-type photoconductive particles agglomerate with each other, and thus, the photoconductive particles are not uniformly dispersed. This results in a reduction in the sensitivity of the photoelectric conversion layer.

As described above, according to example embodiments discussed herein, a paste for a photoelectric conversion layer is prepared using a solvent having a boiling point in a certain range, and thus, the solvent is suppressed and/or prevented from remaining in the photoelectric conversion layer. Moreover, the paste enables satisfactory dispersion of photoconductive particles, thereby reducing surface roughness of the photoelectric conversion layer, which results in increased sensitivity thereof.

It should be understood that the example embodiments described therein should be considered in a descriptive sense only and not for purposes of limitation. Descriptions of features or aspects within each example embodiment should typically be considered as available for other similar features or aspects in other example embodiments.

What is claimed is:

1. A paste for a photoelectric conversion layer, the paste comprising:
    photoconductive particles;
    an organic polymer binder;
    a first organic solvent to dissolve the organic polymer binder; and
    a second organic solvent having a boiling point in a range of between about 150° C. and about 210° C., inclusive, the second organic solvent different from the first organic solvent.

2. The paste of claim 1, wherein the photoconductive particles include one of $HgI_2$ particles, $PbI_2$ particles, $BiI_3$ particles, TlBr particles, PbO particles, CdTe particles, CdZnTe particles, and any mixtures thereof.

3. The paste of claim 2, wherein the photoconductive particles include $HgI_2$ particles.

4. The paste of claim 1, wherein the organic polymer binder includes one of a polyvinyl butyral (PVB) resin, an acryl resin, a phenoxy resin, a polyester resin, a polyvinyl formal resin, a polyamide resin, a polystyrene resin, a polycarbonate resin, a polyvinyl acetate resin, a polyurethane resin, an epoxy resin, and any mixtures thereof.

5. The paste of claim 4, wherein the organic polymer binder includes one of a polyvinyl butyral (PVB) resin, an acryl resin, a phenoxy resin, and any mixtures thereof.

6. The paste of claim 1, wherein the first organic solvent dissolves the organic polymer binder to form a binder solution.

7. The paste of claim 1, wherein the first organic solvent includes dipropylene glycol monomethyl ether (DPGME).

8. The paste of claim 1, wherein the second organic solvent includes one of butyl cellosolve acetate (BCeA), KOCOSOL, butyl cellosolve (BC), ethyl 3-ethoxypropionate (EEP), and any mixtures thereof.

9. The paste of claim 1, wherein an amount of the organic polymer binder is in a range of between about 2.5 and about 15, inclusive, parts by weight with respect to about 100 parts by weight of the photoconductive particles.

10. The paste of claim 1, wherein an amount of the first organic solvent is in a range of between about 3 wt % and about 10 wt %, inclusive, with respect to a total weight of the paste.

11. The paste of claim 10, wherein an amount of the second organic solvent is in a range of between about 5 wt % and about 40 wt %, inclusive, with respect to the total weight of the paste.

12. The paste of claim 1, wherein an amount of the second organic solvent is in a range of between about 5 wt % and about 40 wt %, inclusive, with respect to a total weight of the paste.

13. An X-ray detector comprising:
    a readout device on a substrate; and
    a photoelectric conversion layer on the readout device, the photoelectric conversion layer being formed from the paste of claim 1.

14. The X-ray detector of claim 13, wherein the readout device includes a switching device and a charge storage device electrically connected by a pixel electrode.

15. The X-ray detector of claim 14, wherein the switching device is a thin film transistor device and the charge storage device is a capacitor.

16. A method of manufacturing a photoelectric conversion layer, comprising:
    coating a paste on a substrate, the paste including photoconductive particles, an organic polymer binder, a first organic solvent to dissolve the organic polymer binder, and a second organic solvent having a boiling point in a range of between about 150° C. and about 210° C., inclusive, the second organic solvent different from the first organic solvent; and
    heat treating the substrate with the paste coated thereon.

17. The method of claim 16, wherein the substrate and the paste coated thereon are heat treated at a temperature in a range of between about 50° C. and about 80° C., inclusive.

18. The method of claim 16, wherein the photoconductive particles include one of $HgI_2$ particles, $PbI_2$ particles, $BiI_3$ particles, TlBr particles, PbO particles, CdTe particles, CdZnTe particles, and any mixtures thereof.

19. The method of claim 16, wherein the organic polymer binder includes one of a polyvinyl butyral (PVB) resin, an acryl resin, a phenoxy resin, a polyester resin, a polyvinyl formal resin, a polyamide resin, a polystyrene resin, a polycarbonate resin, a polyvinyl acetate resin, a polyurethane resin, an epoxy resin, and any mixtures thereof.

20. The method of claim 16, wherein the first organic solvent includes dipropylene glycol monomethyl ether (DPGME).

21. The method of claim 16, wherein the second organic solvent includes one of butyl cellosolve acetate (BCeA), KOCOSOL, butyl cellosolve (BC), ethyl 3-ethoxypropionate (EEP), and any mixtures thereof.

22. The method of claim 16, wherein an amount of the organic polymer binder is in a range of between about 2.5 and about 15, inclusive, parts by weight with respect to about 100 parts by weight of the photoconductive particles.

23. The method of claim 16, wherein the heat treating removes the second organic solvent from the coated paste.

24. The method of claim 16, wherein an amount of the first organic solvent is in a range of between about 3 wt % to and about 10 wt %, inclusive, with respect to a total weight of the paste.

25. The method of claim 16, wherein an amount of the second organic solvent is in a range of between about 5 wt % to and about 40 wt %, inclusive, with respect to the a total weight of the paste.

\* \* \* \* \*